United States Patent

Bulling et al.

(10) Patent No.: US 6,621,247 B1
(45) Date of Patent: Sep. 16, 2003

(54) ELECTRONIC MONITORING DEVICE FOR A MULTIPART ELECTRICAL ENERGY STORAGE UNIT

(75) Inventors: Marcus Bulling, Biberach (DE); Hans-Georg Hornung, Waal (DE); Markus Walter, Metzingen (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/743,508

(22) PCT Filed: May 11, 2000

(86) PCT No.: PCT/EP00/04273
§ 371 (c)(1),
(2), (4) Date: Feb. 7, 2002

(87) PCT Pub. No.: WO00/68700
PCT Pub. Date: Nov. 16, 2000

(30) Foreign Application Priority Data

May 11, 1999 (DE) .......................................... 199 21 675

(51) Int. Cl.$^7$ ............................................. H01M 10/46
(52) U.S. Cl. ................................................. 320/116
(58) Field of Search ................. 320/110, 116, 320/118, 119, 120, 121, 134, 136; 324/426

(56) References Cited

U.S. PATENT DOCUMENTS 5,578,927 A * 11/1996 Perelle
5,652,498 A    7/1997 Edye et al.
6,020,717 A * 2/2000 Kadouchi et al.
6,133,709 A * 10/2000 Puchianu

FOREIGN PATENT DOCUMENTS

| JP | 08140204 | 5/1996 |
| WO | WO 98/32181 | 7/1998 |

* cited by examiner

Primary Examiner—Edward H. Tso
(74) Attorney, Agent, or Firm—Crowell & Moring LLP

(57) ABSTRACT

An electronic monitoring unit for an electrical energy storage system that comprises multiple series connected components, includes a corresponding number of measurement devices. Each measurement device is connected to one such component and measures at least one storage status indicator thereof. In one embodiment, the measurement devices are connected in series, and each successive measuring device evaluates the measurement value for its associated storage device relative to measurement data received from the previous measuring device, based on one of more prespecified evaluation criteria. Alternatively, the measurement devices are connected in parallel to a joint signal connection and transfer their measurement values in parallel through the joint signal connection, in a form suitable for the determination of minimum and maximum values.

17 Claims, 2 Drawing Sheets

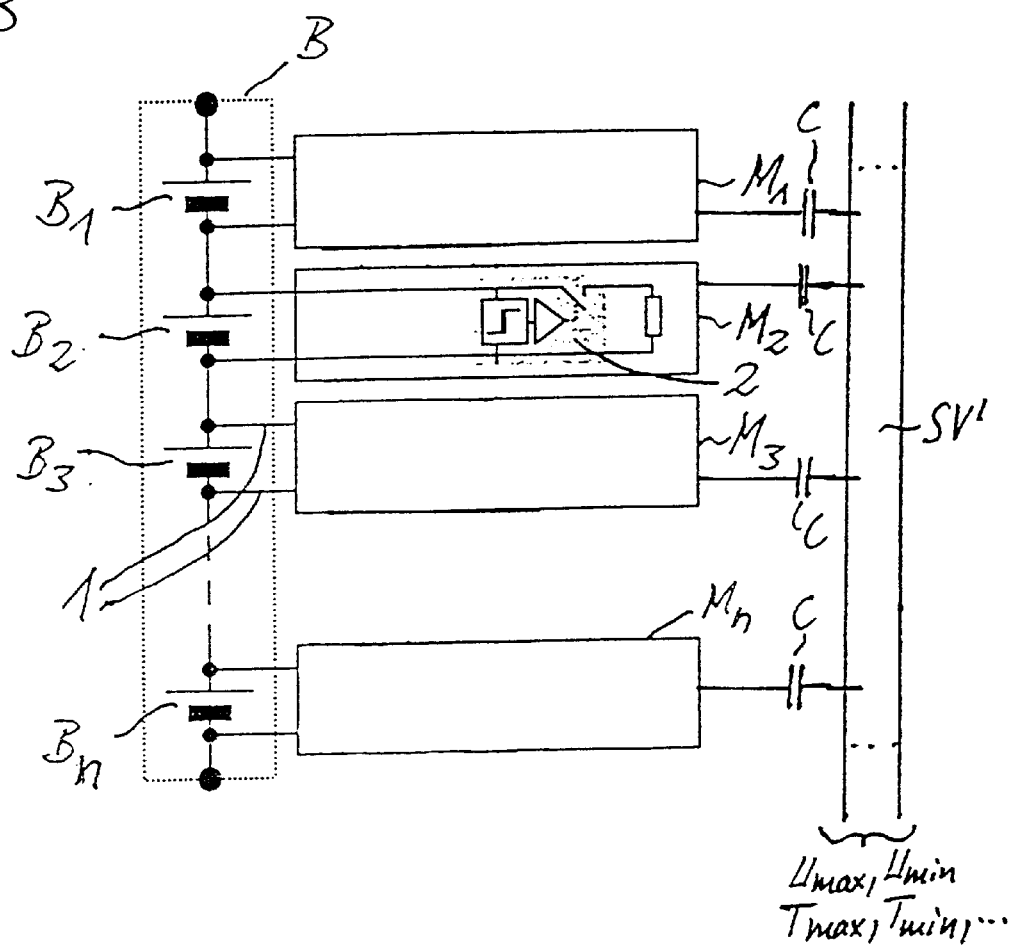

ELECTRONIC MONITORING DEVICE FOR A MULTIPART ELECTRICAL ENERGY STORAGE UNIT

BACKGROUND AND SUMMARY OF THE INVENTION

This application claims the priority of German patent document 199 21 675.4, filed May 11, 1,999 and PCT International Application No. PCT/EP00/04273, filed May 11, 2000, the disclosures of which is expressly incorporated by reference herein.

The invention refers to an electronic monitoring unit for an electrical energy storage system which includes multiple series connected components and particularly to a multiple cell or multiple block battery, where the monitoring unit contains a corresponding number of measuring devices, with one device allocated to each storage component, and where each device measures at least one storage status parameter for the associated storage component. For simplicity, the term "electrical energy storage system" is in this instance defined to include also energy producers, such as fuel cell systems, which generate electrical energy from non-electrical stored energy, such as mechanical or chemical energy, in addition to simple storage devices, such as batteries.

Such monitoring units monitor the status of individual blocks or cells of the electrical energy storage system, such as a traction battery of an automobile with an electrical or hybrid motor, or a stack of fuel cells, such as in a fuel cell vehicle. The storage status indicator typically monitored are specifically the electrical voltage deriving from the storage component being monitored as well as the temperature and pressure of the storage device. The monitoring serves, among other purposes, to determine the present storage status of the storage devices due to variable self-discharge and aging of the series connected storage devices, so that corrective measures may be taken if needed, such as charge transfer between storage devices to keep the charge levels essentially equalized and to avoid having the "weakest" storage device determine the total capacity of the electrical energy storage system.

German Patent Document DE 195 03 917 C2 discloses a monitoring unit of the type described above, in which the individual measuring devices are connected to a serial data bus, formed as a ring, which is also connected to a central data processing unit. The measurements are transferred from measuring device to measuring device around the ring, and each measuring device retrieves the information it requires from the data packet and adds its own measuring data, such as voltage and temperature of the respective storage device. The central data processing unit can then evaluate the measurement data to determine the status of the individual storage components and thus the status of the complete energy storage system.

In an additional type of battery monitoring system, the measuring devices allocated to each individual storage component are connected in parallel to a joint signal connection. Such a unit, as disclosed in European Patent Document EP 0 277 321 A1, transfers the measurements to a central data processing unit from each measurement device in turn as polled.

One object of the present invention is to provide an electronic monitoring device of the type described above, which requires comparatively little cabling and control, and which provides reliable data regarding the status of the energy storage device by processing of one or more relevant measurement parameters.

This and other objects and advantages are achieved by the present invention which provides an electronic monitoring device that requires relatively little cabling and allows the determination of at least the generally most interesting and most relevant extreme values of the parameter or parameters in use, to indicate the status of the electrical energy storage system.

For this purpose, in the system according to the invention measurement parameters are transferred successively from one measuring device to the next, with each successive measuring device evaluating the measurement value for its associated storage device with respect to the measurement data as received, according to one or more prespecified evaluation criteria. In the case of an extreme (that is, maximum and minimum) value criterion, for example, this evaluation consists of determining whether the current measurement is larger or smaller than the previous extreme value as received, and then transferring the thus possibly modified extreme value to the next measurement device. The measurement devices do not need to be normed to their dielectric strength.

In one embodiment of the invention, the measurement devices are connected in parallel to a joint signal connection. These devices coordinate the transmission of the measurement parameters in parallel into the signal wiring, so that the wiring contains the identifiable extreme values on an overall basis ready for evaluation. Such configuration requires no separate signal wiring between each pair of measurement devices, and no separate evaluation process in the measurement devices themselves. Rather, evaluation occurs automatically through overlays of the measurement data from the various measurement devices in the common signal wiring. The measurement devices may be triggered simultaneously without run time error. In a variation of this embodiment the measurement devices are connected to the joint signal wiring via a capacitance or an inductance and are thus galvanically decoupled.

In a further embodiment of the invention, the measurement devices may be switched on and off by operation mode control signals from the control unit, with the devices using a minimum of electricity while turned off. Depending on the system specifications, the signals from the control unit may be sent in parallel to the measurement devices over a joint signal wire, or may be passed sequentially from one measurement device to the next. By use of these operation mode control signals, any measurement devices not presently required may be held in a deactivated state to save on electricity.

In a further embodiment of the invention, the measurement devices may be switched among various measurement modes by measurement mode signals from the control unit, such as between evaluation of the maximum or minimum of a particular parameter or among evaluations of various parameters. Thus, various measurements may be available at various times on the same signal wire.

In still another embodiment of the invention, the measurement devices may be subdivided into active and passive measurement devices. Active measurement devices are defined as those with a full range of functions, while passive measurement devices are those which are in a state where they can transmit signals received (such as measurements from an adjacent measurement device), but do not modify such transmitted signals on the basis of their own measurements. Thus, the system with sequential transmission and evaluation of the measurements may select measurement devices as desired to participate actively in the measurement of evaluated parameters.

In a further embodiment of the invention, the measurement devices transmit the measurement signal in a pulse-width modulated format, with the pulse width representing the respective measurement value. This enables very simple extreme value determinations within the framework of a corresponding extreme value evaluation criterion, and avoids error accumulation in the process of serial transmission of the measurement data from measurement device to measurement device. An alternative variation of this embodiment includes conditioning of the measurement signal such that each signal consist of a pulse, which is sent with a delay peculiar to the respective measurement value. This type of measurement signal will likewise allow for very simple extreme value determinations. As a further alternative, conditions the measurement signal may be conditioned as a constant current signal, which likewise allows for a simplified determination of the extreme value.

Finally, in a further configuration of the invention, the monitoring system enables a dissipative equalization of the charge status, each of the measurement devices containing an electrical resistance for discharging those storage components in which an excessively high charge is detected sufficiently to keep the maximum difference of the charges among the storage components below a prespecified tolerance value.

Other objects, advantages and novel features of the present invention will become apparent from the following detailed description of the invention when considered in conjunction with the accompanying drawings.

BRIEF DESCRIPTION OF THE DRAWINGS

FIG. 3 shows variation of the apparatus according to FIG. 1 in which the measurement devices are connected in parallel.

DETAILED DESCRIPTION OF THE DRAWINGS

Figure 1:
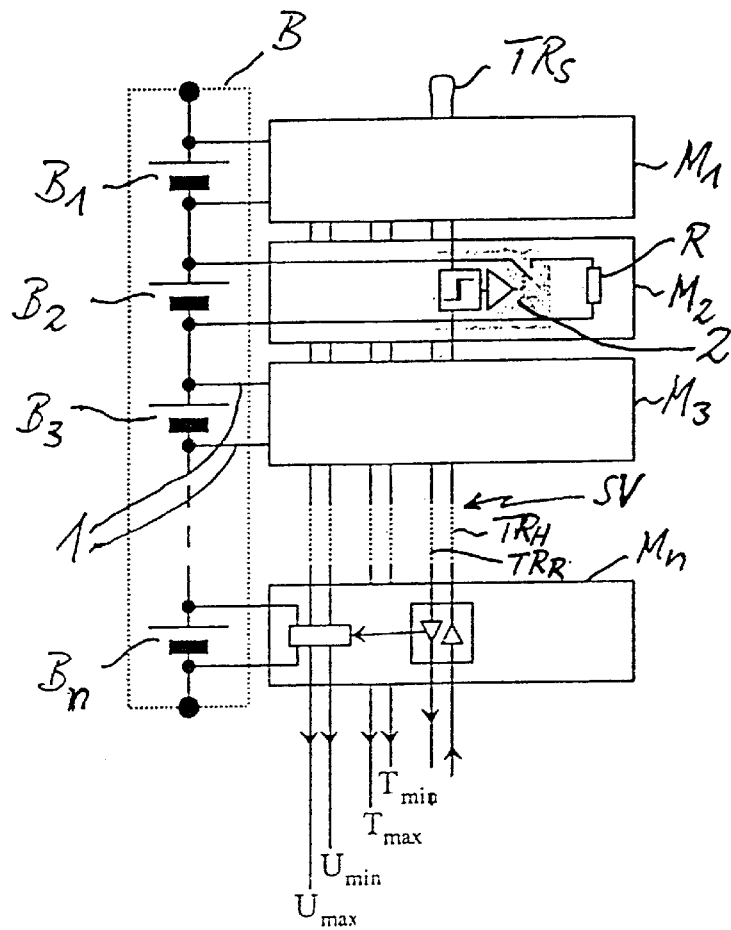
FIG. 1 is a block diagram of a multi-cell battery with a dedicated electronic monitoring system and serially connected measurement devices.

FIG. 1 depicts schematically a battery B, consisting of several individual cells $B_1, B_2, \ldots B_n$, connected in series, which may serve, for example, as a traction battery for an electric vehicle or a vehicle with hybrid propulsion. Each battery cell $B_1, \ldots B_n$ has a dedicated measurement device $M_1, \ldots M_n$, which measures one or more parameters of significance for its storage status such as voltage, temperature and pressure, by means of a measurement connection 1.

The measurement devices $M_1, \ldots M_n$ are connected to each other by means of a serial signal connection SV, which consists of a pair of trigger wires $TR_H$ and $TR_R$, a pair of voltage signal wires $SP_{min}$ and $SP_{max}$ and a pair of temperature signal wires $TE_{min}$ and $TE_{max}$. The pair of trigger wires includes a trigger signal source wire $TR_H$, which transmits a trigger signal sequentially from the last measurement device $M_N$ to the first measurement device $M_1$, and a trigger signal return $TR_R$, which is a connection between the first measurement device $M_1$ and the trigger signal source wire $TR_H$, as is indicated by the wire loop $TR_S$, and which leads back to the last measurement device $M_N$. A conventional trigger is connected to the pair of trigger wires $TR_H$ and $TR_R$ for each measurement device $M_1, \ldots M_n$, which activates the measurement device upon receipt of a corresponding signal to carry out a measurement and evaluation.

In the current example, the measurement devices $M_1, \ldots M_n$ perform the measurement and evaluations in such a way that the maximum value and the minimum value of voltages and temperatures of the individual battery cells $B_1, \ldots B_n$ can be determined. The four extreme values thus determined are present at the terminal of the respective signal wires at the downstream end of the first measurement device; i.e., the minimum voltage value is present $U_{min}$ at the voltage signal wire $SP_{min}$, the maximum voltage value is present $U_{max}$ at the voltage signal wire $SP_{max}$, the minimum temperature value $T_{min}$ is present at the temperature signal wire $TE_{min}$ and the maximum temperature value $T_{max}$ is present at the temperature signal wire $TE_{max}$. Alternative system configurations may designate only some of these extreme values and/or the additional determination of corresponding extreme values for the pressure in the various battery cells. Depending on the evaluation criteria in use, in lieu of or in addition to such extreme values, other parameters indicative of the storage status of the individual battery cells $B_1, \ldots B_n$ may be monitored by the set of measurement devices $M_1, \ldots M_n$, that is, the corresponding measurement values may be supplied by the measurement devices $M_1, \ldots M_1$ The determination of the extreme values is done by successive determination of the measurement values for voltage and temperature of the various battery cells $B_1, \ldots B_n$ by the associated measurement device $M_1, \ldots M_n$, the appropriate evaluation of the measurement values obtained relative to the voltage or temperature information received from the previous measurement device, and transfer of the evaluated voltage or temperature data to the next measurement device. This is implemented in the measurement modules $M_1, \ldots M_n$ as follows. For example, initially a monitoring system unit (not shown here) sends a trigger signal "trigger up", as shown in the top diagram in FIG. 2, from the last measurement device $M_n$ to the first measurement device $M_1$, from which it is returned to the last measurement device $M_n$ as a return signal "trigger down", and triggers the measurement process in each measurement device only during the return. This initiates the measurement of the voltage and temperature of the first battery cell B in the first measurement device $M_1$. This information, including the minimum and maximum values of voltage and temperature, is then passed to the second measurement device $M_2$. The second measurement device $M_2$ receives these measurement data and in turn measures the voltage and temperature of the second battery cell $B_2$. It then evaluates both parameters and determines whether its own measurement of the voltage for the second battery cell $B_2$ is larger or smaller than the received voltage value for the first battery cell $B_1$. It then sends the smaller voltage value as the minimum voltage value $U_{min}$ and the larger voltage value as the maximum voltage value $U_{max}$ to the third measurement device $M_3$. An analogous process applies to temperature as the second parameter.

The third measurement device $M_3$, in turn, measures voltage and temperature of the third battery cell $B_3$ and compares the resulting voltage value against the previous minimum voltage value $U_{min}$ as received and also against the previous maximum voltage value $U_{max}$ as received. It sends the smaller value from the minimum value comparison as the current minimum voltage value to the next measurement device, as well as the larger value of the maximum value comparison as the current maximum voltage value to the next measurement device. An analogous process applies to temperature as the second parameter.

In this way, the four extreme values $U_{min}$, $U_{max}$, $T_{min}$, and $T_{max}$ are received in each case from the previous measurement device, compared to the current measurement data and passed on as updated to the next measurement device, until eventually the last measurement device $M_n$ yields the voltage and temperature extreme values $U_{min}$, $U_{max}$, $T_{min}$, and $T_{max}$ that apply for the totality of the individual battery cells $B_1, \ldots B_n$, for transfer e.g. to the monitoring system unit.

Since the measurement devices $M_1, \ldots M_n$ are triggered only by the return signal "trigger down", the measurement device farthest from the location where the trigger signal originates, namely from the last measurement device $M_n$ in the chain of measurement devices, (that is, the first measurement device $M_1$) is first to be triggered. As a result, there is an advantageous compensation for the trigger signal propagation time, which is reflected in the delay of the returned trigger signal "trigger down" relative to the generated trigger signal "trigger up", as shown in the middle diagram of FIG. 2. Such a compensation for the trigger signal propagation time may also be derived, if the measurement devices $M_1, \ldots M_n$ are already activated by the trigger signal "trigger up" as sent, but the voltage and temperature data are taken from the measurement device which is triggered last at the opposite end of the chain of measurement devices from the location where the trigger signal originates.

Figure 2:
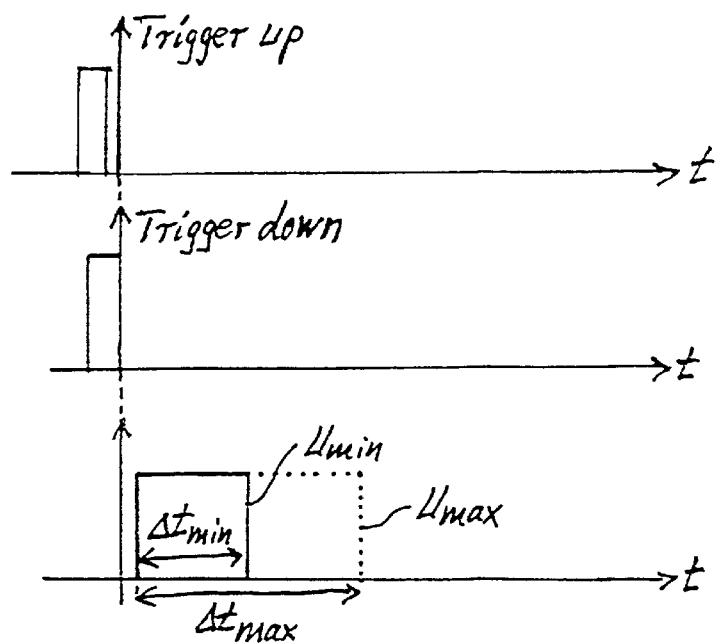
FIG. 2 is a schematic wave diagram that shows the trigger signals and voltage measurement signals, to explain operation of the monitoring system shown in FIG. 1.

A simple evaluation of the extreme values of the measurement signal information may be achieved by using pulse-width modulated measurement signals, where the pulse width represents the corresponding measurement value, as shown by the voltage signal in the lower portion of FIG. 2. The signal for the minimum voltage is shown here with a solid line for a pulse width $\Delta t_{min}$, which represents the minimum voltage value $U_{min}$. Likewise, the signal for the maximum voltage is shown here with a dashed line for a pulse width $\Delta t_{max}$, which represents the maximum voltage value $U_{max}$. The determination of the minimum value can then be handled in each measurement device by a simple AND-linkage of its own measurement value with the previous minimum value sent by the previous measurement device, such that the result forms the new minimum value by selecting the smaller of the two compared signals. In the same way, the evaluation of the maximum value may be handled by a simple OR-linkage of the own measurement value with the previous minimum value sent by the previous measurement device, where the result forms the new maximum value by selecting the wider of the two compared signals.

The speed of measurement for a measurement cycle using such pulse-width modulated measurement signals depends primarily on the product of the maximum pulse width and the number of devices n. The use of pulse-width modulated measurement signals prevents the accumulation of error in the transmission of measurement parameters from one measurement device to the next; there is merely an increase in the differences of propagation time.

As an alternative to the previously described use of pulse-width modulated measurement signals, the measurement data may also be transmitted and evaluated throughout the chain of measurement devices simply as analog measurement data, particularly in the extreme values of the measurement parameters as examined. This situation requires no trigger signal, rather the measurements may be done quasi-parallel, and the measurement data may be evaluated and transmitted serially. Independently of the configuration of the measurement data, there is a general advantage to the serial linkage of the measurement devices $M_1, \ldots M_n$ across the serial signal connection SV inasmuch as the measurement devices $M_1, \ldots M_n$ do not need to be configured to withstand excessive voltage.

The further possible configuration of the evaluated and transmitted measurement data, a pulse with a constant impulse width is used as the measurement signal, which is generated at a point in time depending on the measurement value to be coded, that is, delayed relative to a reference time by a time period, which itself is a function of the measurement value. This variation allows for the transfer of a maximum value as well as a minimum value on a common transmission wire without a coded trigger signal, in which, for example, the minimum value corresponds to the earliest pulse and the maximum value corresponds to the latest pulse and where intermediate pulses are not transmitted further. Then, an OR-test between the own measurement signal against the received earliest or latest pulse suffices for the evaluation regarding the minimum and maximum values of the respective parameters, such as voltage, temperature or pressure. Care must only be taken to provide for an equalization of the constant pulse width between the measurement devices $M_1, \ldots M_n$.

To the extent that the configuration of the measurement signal in use contains a coding of measurement values by digital signals, it is understood that the measurement devices $M_1, \ldots M_n$ will contain an appropriate analog/digital converter and that the signal evaluation component of the monitoring system contains an appropriate traditional digital signal processor.

Several advantageous modifications to the monitoring system shown in FIG. 1 and described above are possible. For example, the successive transfer of an operation mode control signal across the chain of measuring devices may be designed via the pair of trigger wires $TR_H$ and $TR_R$ or an independent serial control signal connection, by which the measuring devices $M_1, \ldots M_n$ can be switched between an activated state, in which they can carry out the described measuring and evaluation steps, and a deactivated state, in which they use no (or at most a very minor amount of) electricity, so as to minimize the electricity consumption overall. It is preferable that each measurement device $M_1, \ldots M_n$ is supplied by its associated battery cell $B_1, \ldots B_n$.

In a further variation, the design may include the transmission of an evaluation mode control signal, by which the measuring device $M_1, \ldots M_n$ may be switched between alternative evaluation modes; such as between the evaluation of maximum voltage while charging, and minimum voltage while discharging, or alternating between an evaluation of pressure and temperature or any other potential evaluations. In this case, a single signal wire may suffice, which will then transmit the parameter data for the currently active evaluation mode. A further modification may design the transmission of a selection control signal through the chain of measurement devices, by which the appropriately constructed measurement modules $M_1, \ldots M_n$ may be switched between an actively measuring state and a passive, merely transmitting state. In this way, an arbitrary subset of the measurement devices may be selected to supply measurements for certain items, while the rest of the measurement devices will merely retransmit the data as received without modification. This could, for example, determine the minimum and/or maximum values of a parameter for a particular subset of the battery cells $B_1, \ldots B_n$.

Another embodiment of the invention shown in FIG. 3, which is an alternative to the monitoring type of FIG. 1, includes a parallel connection of the measurement devices $M_1, \ldots M_n$ to a common signal connection SV' consisting of one or more signal wires, in lieu of the serial signal connection SV. It is preferable to connect the measurement devices $M_1, \ldots M_n$ to a common signal connection SV' by means of a capacitance C, as indicated, or an inductance and with galvanic decoupling. In this embodiment, the measurement data and possibly also the trigger and/or control signals are passed not from one measurement device to the next, but in parallel to the joint signal connection SV. This may be done for the coded measurement data, for example, as a voltage jump, which is placed from the respective measurement device to the joint signal wire. Additional potential signal conditioning may consist of placing the measurement signal as a constant current signal to the joint signal wire, which may act as a summary wire by terminating with a resistance against a pole of battery B, where the measurement is then represented by the current intensity.

The joint and parallel signal connection of measurement devices $M_1, \ldots M_n$ is particularly well suited for determination of the minimum and maximum of a particular parameter, without requiring an AND or OR evaluation in the various measurement devices. For example, if a measurement signal is coded as a pulse-width modulated measurement signal, the maximum value is represented by the pulse width of the combined signal on the common signal wire fed by the pulse-width modulated signals of measurement devices $M_1, \ldots M_n$. The measurement devices $M_1, \ldots M_n$ may be triggered simultaneously without run-time error in this type of system. The capacitance used for a galvanic decoupling may possibly be realized by a track conductor. Furthermore, this system type with a joint signal connection has the same properties and advantages, such as are listed for the system type of FIG. 1 with serial signal connection.

The parameter data derived by any of one of the embodiments described above may be evaluated in an appropriate way, particularly for the purpose of recognizing undesirable conditions in particular battery cells and to initiate appropriate counter measures. One such measure is a dissipative equalization of the charge status, so that excessive differences of charges between individual battery cells may be avoided by a sufficient discharge from cells with excessive charge by means of an electrical resistance. For this purpose, each measurement device $M_1, \ldots M_n$ contains an appropriate resistance R, which may be attached in parallel to a battery cell for its discharge, and a corresponding discharge control switch 2. The resistance value is determined primarily by the difference of the self discharge properties of all battery cells $B_1, \ldots B_n$ and the length of time within which a maximum charge difference is to be equalized. A lower limit of the resistance value may be given by the maximum warming permitted on site. Losses from dissipative discharge in batteries with small capacity in uses with high charge throughput are a minor component of the total ordinary losses, and are thus tolerable.

So that the respective measurement device may learn whether it is to discharge its battery cell or not, the previously developed information regarding the minimum voltage value $U_{min}$ is made available to all measurement devices $M_1, \ldots M_n$; in the case of FIG. 1, this means that the information is passed from the last measurement device $M_n$ in succession to the other measurement devices up to the first measurement device $M_1$. Each measurement device $M_1, \ldots M_n$ then compares the minimum voltage value $U_{min}$ to its own measurement of its battery cell $B_1, \ldots B_n$ and activates the dissipative discharge process, whenever its voltage value exceeds the minimum voltage value $U_{min}$ by more than a pre-specified value. In an advantageous design the trigger impulse or the trigger signal connection $TR_H$ and $TR_R$, which are required in any case, are used for serial transmission of the minimum voltage value $U_{min}$. The pre-specified allowable tolerance value for the deviation of the charge status among the battery cells may be added to the minimum voltage value from the very beginning, so that each measurement device $M_1, \ldots M_n$ needs merely to compare its own measurement against the minimum voltage $U_{min}$ transmitted via the trigger wires $TR_H$ and $TR_R$ in order to decide whether to undertake a dissipative discharge of its cell.

Even though the invention has been described in the above by reference to a battery B, it is understood that it is useful also for other conventional electrical energy storage devices or energy producers, such as for a stack of fuel cells in a fuel cell system, which may be stationary or mobile, such as in a fuel cell vehicle.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A monitoring apparatus for an energy storage system having a plurality of series connected storage components, said apparatus comprising:

a plurality of measurement devices, each of which measures at least one parameter related to a storage status of an associated storage component to which it is coupled; and a serial signal connection between the measurement devices;

wherein each successive measurement device receives measurement data generated by a preceding measurement device via said serial signal connection and generates and transmits its own measurement data based on a comparison of corresponding measurement values for its associated storage component, based on a pre-determined evaluation criterion.

2. A monitoring apparatus for an energy storage system having a plurality of series connected storage components, said apparatus comprising:

a plurality of measurement devices, each of which measures at least one parameter related to a storage status of an associated storage component to which it is coupled; and a joint signal connection to which said measurement devices are connected in parallel;

wherein, measured values are transmitted in parallel via the joint signal connection in a form, which is coded from the measurement values with regard to the derivation of an extreme value.

3. The monitoring system according to claim 2, wherein the measurement devices are connected to the joint signal connection via one of a capacitance and an inductance.

4. The monitoring system according to claim 1, further comprising means for switching the measurement devices between an activated and a deactivated status in response to an operation mode control signal.

5. The monitoring system according to claim 2, further comprising means for switching the measurement devices between an activated and a deactivated status in response to an operation mode control signal.

6. The monitoring system according to claim 1, further comprising means for switching the measurement devices between various evaluation modes in response to an evaluation mode control signal.

7. The monitoring system according to claim 2, further comprising means for switching the measurement devices between various evaluation modes in response to an evaluation mode control signal.

8. The monitoring system according to claim 1, further comprising means for selectively switching the measurement devices between a fully active status and a passive operational status in which received signals are retransmitted without processing.

9. The monitoring system according to claim 2, further comprising means for selectively switching the measurement devices between a fully active status and a passive operational status in which received signals are retransmitted without processing.

10. The monitoring system according to claim 1, wherein the measurement devices are equipped for coding of the measurement values in pulse-width modulated signals.

11. The monitoring system according to claim 2, wherein the measurement devices are equipped for coding of the measurement values in pulse-width modulated signals.

12. The monitoring system according to claim 1, wherein the measurement devices are equipped for coding of the measurement values in the pulse signals, with a pulse delay that is a function of a magnitude of a measurement value.

13. The monitoring system according to claim 2, wherein the measurement devices are equipped for coding of the measurement values in the pulse signals, with a pulse delay that is a function of a magnitude of a measurement value.

14. The monitoring system according to claim 1, wherein the measurement devices are equipped for coding of measurement values in constant current signals with a current intensity that is a function of a magnitude of a measurement value.

15. The monitoring system according to claim 2, wherein the measurement devices are equipped for coding of measurement values in constant current signals with a current intensity that is a function of a magnitude of a measurement value.

16. The monitoring system according to claim 1, wherein each measurement device includes an electrical resistance and means for a controlled discharging connection of the resistance to its associated storage component.

17. The monitoring system according to claim 2, wherein each measurement device includes an electrical resistance and means for a controlled discharging connection of the resistance to its associated storage component.

* * * * *